United States Patent [19]
Sugoh et al.

[11] Patent Number: 5,539,223
[45] Date of Patent: Jul. 23, 1996

[54] WIRING STRUCTURE OF SOURCE LINE USED IN SEMICUSTOM INTEGRATED CIRCUIT

[75] Inventors: Takeshi Sugoh, Yokosuka; Hisashi Sugiyama, Yokohama, both of Japan

[73] Assignee: Kabushiki Kaisha Toshiba, Kawasaki, Japan

[21] Appl. No.: 36,838

[22] Filed: Mar. 25, 1993

[30] Foreign Application Priority Data

Mar. 26, 1992 [JP] Japan ................................... 4-068387

[51] Int. Cl.⁶ .............................. H01L 21/82; H01L 27/04
[52] U.S. Cl. ........................... 257/207; 257/500; 257/203
[58] Field of Search ...................................... 257/202, 203, 257/207, 500

[56] References Cited

U.S. PATENT DOCUMENTS

| | | | |
|---|---|---|---|
| 4,563,601 | 1/1986 | Asano et al. | 307/475 |
| 5,067,003 | 11/1991 | Okamura | 257/750 |
| 5,223,744 | 6/1993 | Ohbayashi et al. | 307/303 |

FOREIGN PATENT DOCUMENTS

| | | | |
|---|---|---|---|
| 60-80250 | 5/1985 | Japan . | |
| 0228654 | 10/1986 | Japan | 257/207 |
| 61-253928 | 11/1986 | Japan . | |
| 0264747 | 11/1986 | Japan | 257/207 |
| 0106657 | 5/1987 | Japan | 257/207 |
| 0310945 | 12/1990 | Japan | 257/207 |
| 0027529 | 2/1991 | Japan | 257/207 |
| 0057245 | 3/1991 | Japan . | |
| 0148132 | 6/1991 | Japan | 257/207 |

OTHER PUBLICATIONS

Vu et al., "A Gallium Arsenide SDFl Gate Array with On–Chip Ram," IEEE Journal of Solid–State Circuits, vol. SC–19, No. 1, pp. 10–22, (1984).

"A 209K–Transistor ECL Gate Array with RAM", Satoh et. al., IEE Journal of Solid–State Circuit, 24(5):1275–1279 (1989).

*Primary Examiner*—Robert P. Limanek
*Assistant Examiner*—Alexander Oscar Williams
*Attorney, Agent, or Firm*—Finnegan, Henderson, Farabow, Garrett & Dunner

[57] ABSTRACT

A semicustom integrated circuit comprises pads arranged on peripheral portions of a chip along the four sides thereof. Peripheral circuit cells are arranged on a part of the chip to the inside of the pads. An internal circuit is arranged on a part of the chip to the inside of the peripheral circuit cell. The peripheral circuit cells include an ECL level input circuit an ECL level output circuit, a TTL level input circuit and a TTL level output circuit. Main source lines are formed on the peripheral circuit cells so as to surround the internal circuit. The main source lines are connected to pads to which source potentials is applied. Branch source lines cross the main source lines and connected to a selected one of the peripheral circuit cells and said internal circuit. The main source lines are selectively connected to the branch source lines by an interlayer connecting source line.

5 Claims, 3 Drawing Sheets

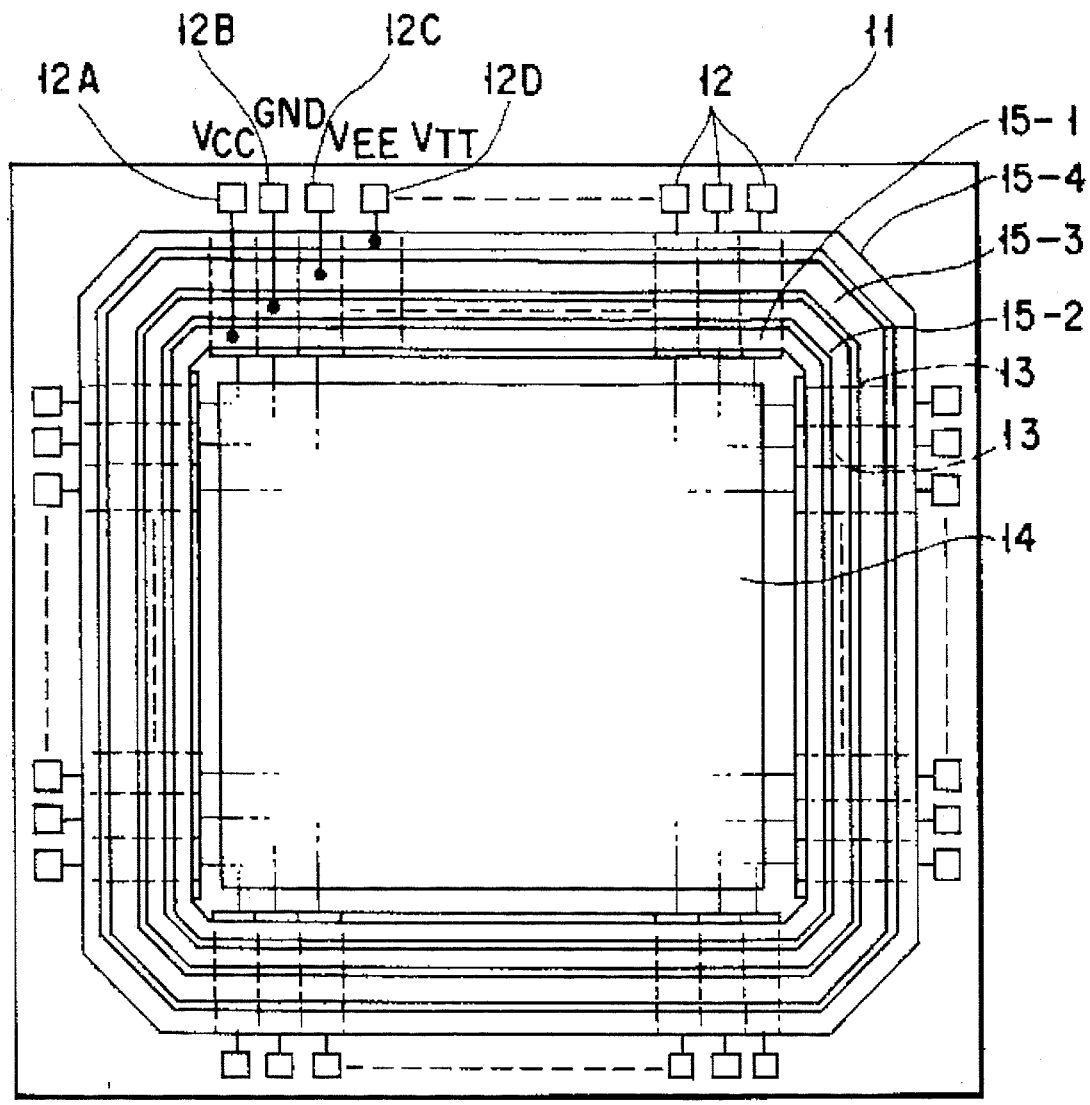
F I G. 1

WIRING STRUCTURE OF SOURCE LINE USED IN SEMICUSTOM INTEGRATED CIRCUIT

BACKGROUND OF THE INVENTION

1. Field of the Invention

The present invention relates to a semicustom integrated circuit (IC or LSI) such as an ECL (Emitter Coupled Logic) gate array, and more particularly to a wiring structure of a source line used in a semicustom integrated circuit.

2. Description of the Related Art

An ECL gate array is disclosed in, for example, Satoh et al., "A 209K-Transistor ECL Gate Array with RAM", IEEE JOURNAL OF SOLID-STATE CIRCUIT, VOL. 24, No. 5 October 1989 pp. 1275–1279. In the conventional ECL gate array disclosed in this document, pads are arranged on peripheral portions of a chip; e.g., along the four sides of the chip. Peripheral circuit cells are arranged at regular pitch on part of the chip to the inside of the pads, while an internal circuit is formed on a part to the inside of the peripheral circuit cells. As an example of the peripheral circuit cells, input/output circuit cells of ECL level is formed along two opposed sides of the chip and input/output circuit cells of TTL (transistor transistor logic) level is formed along the other two opposed sides of the chip. Alternatively, peripheral circuit cells may be arranged as follows:

Input/output circuit cells of ECL level are arranged along the two opposed sides of the chip. Input/output circuit cells of ECL level and input/output circuit cells of TTL level are arranged along one of the other two opposed sides of the chip, and selectively used, thereby enabling either an ECL level signal or a TTL level signal to be input or output. Input/output circuit cells of ECL level are arranged along the other of the two opposed sides. In the conventional ECL gate array as described above, the number and positions of ECL level and TTL level input/output circuit cells are determined in advance. In addition, both the number of input/output circuit cells for selectively inputting and outputting an ECL level signal and a TTL level signal and the positions thereof are limited. For this reason, the internal circuit and the peripheral circuit cells cannot be wired in an optimal manner, with the result that the performance of the ECL gate array is lowered—for example, the operation speed is reduced or skew is increased. Consequently, improvement of utility, which is an advantage of the gate array, is restricted.

The above problem is not confined to an ECL gate array but arises also in a semicustom integrated circuit such as a MOS gate (insulating gate) array and a standard cell type LSI.

SUMMARY OF THE INVENTION

It is accordingly an object of the present invention to provide a semicustom integrated circuit wherein the degree of freedom in selecting a peripheral circuit cell is increased.

Another object of the present invention is to provide a semicustom integrated circuit wherein an internal circuit and peripheral circuit cells can be wired in a desired manner.

Still another object of the present invention is to provide a semicustom integrated circuit having an improved utility.

A further object of the present invention is to provide a semicustom integrated circuit the performance of which is improved.

A still further object of the present invention is to provide a semicustom integrated circuit wherein the operation speed can be increased and skew reduced.

The above objects can be achieved by a semicustom integrated circuit comprising:

pads arranged on peripheral portions of a chip along the four sides thereof;

peripheral circuit cells arranged on a part of the chip to the inside of said pads and selectively connected to the pads, said peripheral circuit cells including a first circuit operated in response to an ECL level signal and a second circuit operated in response to a TTL level signal;

an internal circuit arranged on a part of the chip to the inside of said peripheral circuit cells and selectively connected to said peripheral circuit cells; and a power supplying section, formed on said peripheral circuit cells so as to surround said internal circuit substantially entirely, for selectively supplying power to said peripheral circuit cells and said internal circuit.

Since the source line of the power supply section is selectively connected to the peripheral circuit cells and accordingly the first circuit operated in response to an ECL level signal and the second circuit operated in response to a TTL level signal can be selected freely, the degree of freedom in selecting a peripheral circuit cell is increased. As a result, since an optimal peripheral circuit can be selected in accordance with the design of the internal circuit, the utility of the semicustom integrated circuit is improved. In addition, since a desired peripheral circuit cell for inputting or outputting a signal is selected, the internal circuit and the peripheral circuit cell can be wired in a desired manner, thereby increasing the operation speed and reducing skew. Thus, the performance of the semicustom integrated circuit can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a plan view showing a chip layout of a semicustom integrated circuit according to an embodiment of the present invention;

DETAILED DESCRIPTION OF THE PREFERRED EMBODIMENT

FIG. 1 shows a chip layout of a semicustom integrated circuit according to an embodiment of the present invention. Pads 12 are arranged in peripheral portions of the chip 11 along the four sides. Peripheral circuit cells 13 are arranged at regular pitch in correspondence with the pads 12, in that portion of the chip 11 which is surrounded by the pads 12. The peripheral circuit cells 13 include four circuits: an input circuit of ECL level, an input circuit of TTL level, an output circuit of ECL level, and an output circuit of TTL level. An internal circuit 14 is arranged in a portion surrounded by the peripheral circuit cells 13. The internal circuit 14 is constituted by, for example, an ECL circuit. First to fourth main source lines 15-1 to 15-4 are formed on the peripheral circuit cells 13 so as to surround the internal circuit 14, and selectively supply power to the peripheral circuit cells 13. The first to fourth main source lines 15-1 to 15-4 respectively supplies a first source potential $V_{CC}$ (e.g., +5V), a second source potential (ground potential GND), a third source potential $V_{EE}$ (e.g., −5.2V), and a fourth source potential $V_{TT}$ (e.g., −0.2V) to the peripheral circuit cells. The main source lines 15-1 to 15-4 are respectively connected to pads 12A, 12B, 12C, and 12D to which the source potential $V_{CC}$, the ground potential GND, the source potential $V_{EE}$, and the source potential $V_{TT}$ are applied. The main source lines 15-1 to 15-4 are selectively connected to the above-mentioned four circuits included in the peripheral circuit cells 13 during a wiring process. As a result, the four circuits are selectively connected to the internal circuit 14 in accordance with the structure of the internal circuit 14, and at least two of the source potential $V_{CC}$, the ground potential GND, the source potential $V_{EE}$, and source potential $V_{TT}$ are applied to the selected circuit.

Figure 2:
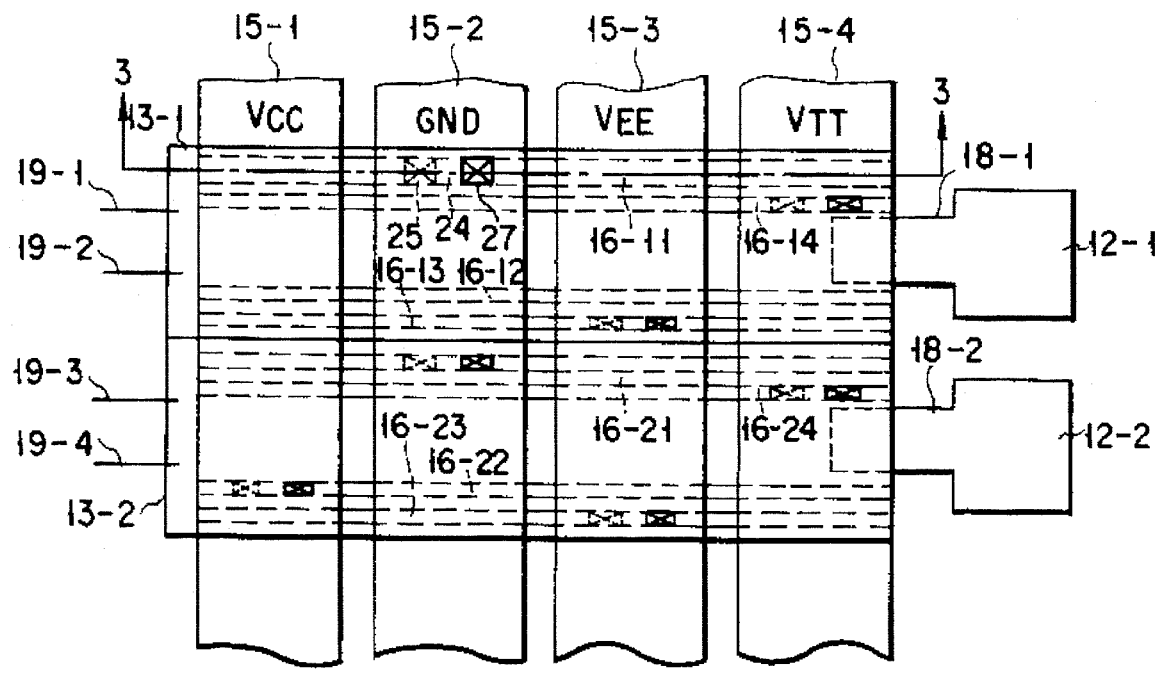
FIG. 2 is a plan view of the pattern of an example of the layout, showing a portion of the peripheral circuit cells and the source line shown in FIG. 1.
Figure 3:
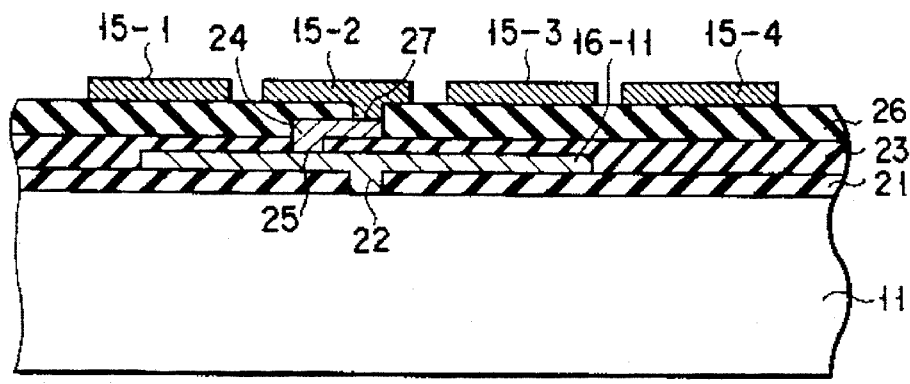
FIG. 3 is a cross sectional view of the pattern shown in FIG. 2 taken along the line 3—3.

FIG. 2 is an enlarged view of an example of the pattern layout showing a portion of the peripheral circuit cells 13 and the main source lines 15-1 to 15-4 of the chip layout shown in FIG. 1. FIG. 3 is a cross-sectional view of the pattern shown in FIG. 2 taken along the line 3—3. FIGS. 2 and 3 particularly show the structure of a power supplying section. The structures of the connecting portion between a pad 12 and a peripheral circuit cell 13 and the connecting portion between a peripheral circuit cell 13 and the internal circuit 14 are basically the same as those in a conventional device. A first insulating layer 21 is formed on the chip 11, on which the peripheral circuit cells are formed. A branch source line 16-11 is formed on the first insulating layer 21, extending in a direction perpendicular to the main source lines 15-1 to 15-4 (branch source lines 16-12 to 16-14, and 16-21 to 16-24 are formed in the same manner). The branch source lines 16-11 to 16-14 and 16-21 to 16-24 are formed of a wiring layer of a first level. A through hole 22 is formed in that portion of the first insulating layer 21 on which a source line of the peripheral circuit cell 13 is formed. The branch source line 16-11 is connected through the through hole 22 to the source line of the peripheral circuit cell 13. A second insulating layer 23 is formed on the branch source lines 16-11 to 16-14 and 16-21 to 16-24. An interlayer connecting source line 24 is formed on the second insulating layer 23. The interlayer connecting source line 24 is formed of a wiring layer of a second level. A through hole 25 is formed in that portion of the second insulating layer 23 on which the branch source line 16-11 is formed. The branch source line 16-11 is connected through the through hole 25 to the interlayer connecting source line 24. A third insulating layer 26 is formed on the interlayer connecting source line 24. The main source lines 15-1 to 15-4 are formed on the third insulating layer 16. The main source lines 15-1 to 15-4 are formed of a wiring layer of a third level. A through hole 27 is formed in that portion of the third insulating layer 26 in which the interlayer connecting source line 24 is formed. The main source line 15-2 is connected through the through hole 27 to the interlayer connecting source line 24. Thus, the main source line 15-2 is electrically connected to the source line of the peripheral circuit cell 13.

Pads 12-1 and 12-2 are selectively connected to a signal input or output terminal of the peripheral circuit cells 13-1 and 13-2 through wires 18-1 and 18-2. The signal input or output terminal of the peripheral circuit cell 13-1 is selectively connected to the internal circuit 14 through wires 19-1 and 19-2. The signal input or output terminal of the peripheral circuit cell 13-2 is selectively connected to the internal circuit 14 through wires 19-3 and 19-4.

In the above structure, the main source lines 15-1 to 15-4 can be connected to the peripheral circuit cells 13 in a desired manner by selecting the positions of the through holes 22, 25, and 27 and the interlayer connecting source line 24. Therefore, the four circuits of the peripheral circuit cells 13 can be selected in accordance with the circuit structure of the internal circuit 14, and a necessary power can be supplied to the selected circuit. Thus, the internal circuit 14 and the peripheral circuit cells 13 can be wired in an optimal manner, thereby increasing the operation speed and reducing skew. As a result, the utility and performance of the semicustom integrated circuit can be improved.

Figure 4:
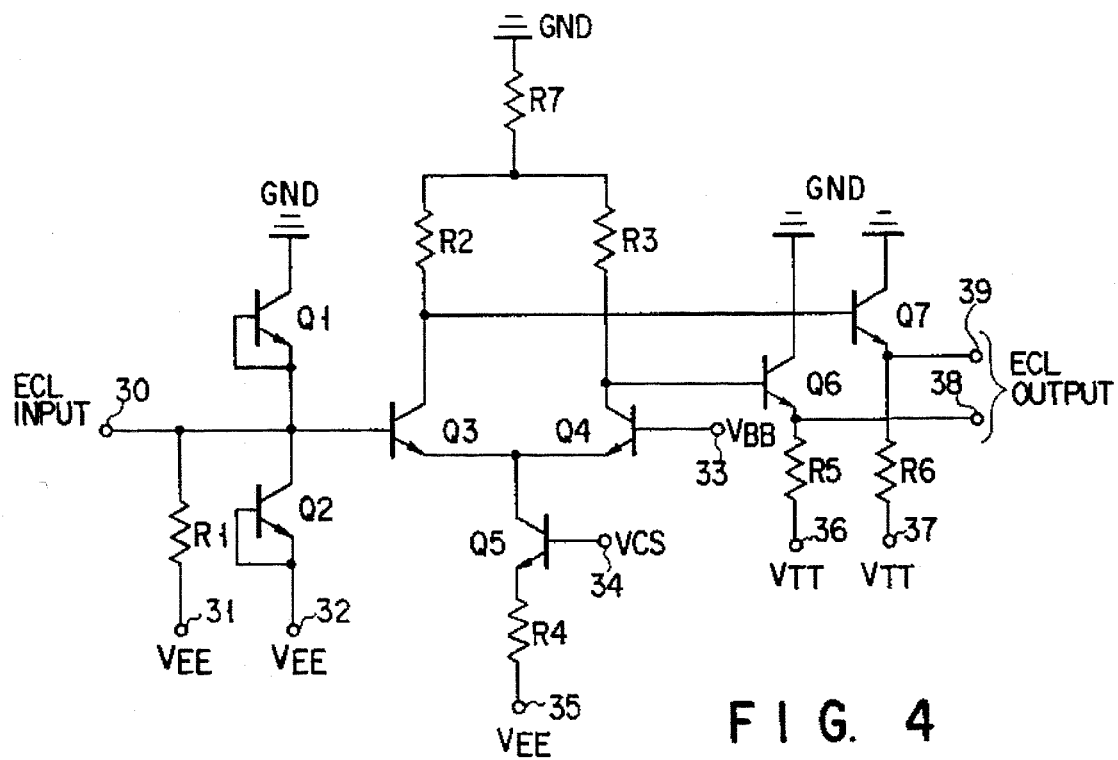
FIG. 4 is a circuit diagram showing a structure of the peripheral circuit cells shown in FIG. 1, in which an ECL level input buffer circuit is illustrated.

FIG. 4 is a circuit diagram showing an example of the input circuit of ECL level included in the peripheral circuit cells 13. The circuit includes NPN transistors Q1 to Q7 and resistors R1 to R7. An ECL level signal is input to an input terminal 30 (pad 12), which is connected to the base of the transistor Q3. The resistor R1 is connected to the input terminal 30, and to a source terminal 31 to which the source potential $V_{EE}$ is applied. The resistor R1 has a resistance of several tens KΩ and outputs a bias potential if the preceding circuit has an open-low output structure. The base and the emitter of the transistor Q1 are connected to the input terminal 30 and the collector thereof is connected to the ground GND. The collector of the transistor Q2 is connected to the input terminal 30 and the base and the emitter thereof are connected to a source terminal 32 to which the source potential $V_{EE}$ is applied. The transistors Q1 and Q2 serve as circuits for protecting the transistor Q3. The emitter of the transistor Q3 is connected to the emitter of the transistor Q4. The base of the transistor Q4 is connected to a bias terminal 33 to which a bias potential $V_{BB}$ generated within the chip is applied. The collectors of the transistors Q3 and Q4 are connected to first ends of the resistors R2 and R3. The resistor R7 is connected between the ground GND and second ends of the resistors R2 and R3. The collector of the transistor Q5 is connected to the emitters of the transistors Q3 and Q4, and the base thereof is connected to a bias terminal 34 to which a bias potential $V_{CS}$ generated within the chip is applied. One end of the resistor R4 is connected to the emitter of the transistor Q5 and the other end thereof is connected to a source terminal 35 to which the source potential $V_{EE}$ is applied. The bases of the transistors Q6 and Q7 are respectively connected to the collectors of the transistors Q4 and Q3. The collectors of the transistors Q6 and Q7 are connected to the ground GND. One end of the resistor R5 is connected to the emitter of the transistor Q6 and the other end thereof is connected to a source terminal 36 to which a source potential $V_{TT}$ is supplied from an external device. One end of the resistor R6 is connected to the emitter of the transistor Q7 and the other end thereof is connected to a source terminal 37 to which the source potential $V_{TT}$ is applied. The emitters of the transistors Q6 and Q7 are respectively connected to output terminals 38 and 39, through which ECL level signals are output and supplied to the internal circuit 14. The ground GND is electrically connected to the main source line 15-2 shown in FIGS. 1 and 2, and the source terminals 31, 32, and 35 are electrically connected to the main source line 15-3. The source terminals 36 and 37 are electrically connected to the main source line 15-4.

In the above circuit, the ECL level signal input to the input terminal 30 is supplied to the base of the transistor Q3. The ECL level input signal is differential-amplified by the transistors Q3 to Q5 and resistors R2 to R4 and R7. A differential-amplified signal thus obtained is supplied to the bases of the transistors Q6 and Q7. As a result, ECL level signals are output from the output terminals 38 and 39 connected to the emitters of the transistors Q6 and Q7. "L" and "H" levels of an ECL level signal is approximately −1.7V and approximately −0.9V, respectively.

Figure 5:
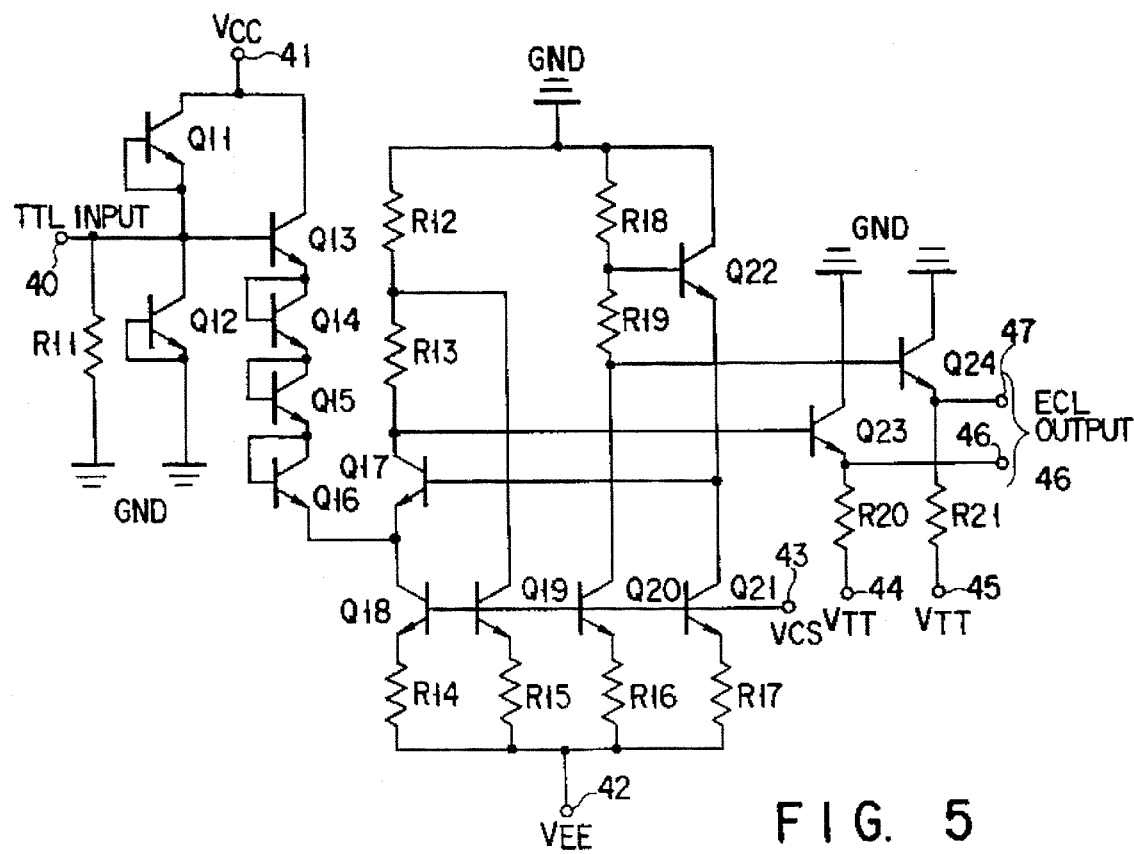
FIG. 5 is a circuit diagram showing another structure of the peripheral circuit cells shown in FIG. 1, in which a TTL level input buffer circuit is illustrated.

FIG. 5 is a circuit diagram showing an example of the input circuit of TTL level included in the peripheral circuit cells 13. The circuit includes NPN transistors Q11 to Q24 and resistors R11 to R21. A TTL level signal is input to an input terminal 40, which is connected to the base of the transistor Q13. The resistor R11 is connected between the input terminal 40 and a ground GND. The resistor R11 has a resistance of several tens KΩ and outputs a bias potential if the preceding circuit has an open-low output structure. The base and the emitter of the transistor Q11 are connected to the input terminal 40 and the collector thereof is connected to a source terminal 41 to which a source potential of $V_{CC}$ is applied. The collector of the transistor Q12 is connected to the input terminal 40 and the base and the emitter thereof are connected to the ground GND. The transistors Q11 and Q12 serve as circuits for protecting the transistor Q13. The collector of the transistor Q13 is connected to the source terminal 41 and the emitter thereof is connected to the base and the collector of the transistor Q14. The emitter of the transistor Q14 is connected to the base and the collector of the transistor Q15 and the emitter of the transistor Q15 is connected to the base and the collector of the transistor Q16. The emitter of the transistor Q16 is connected to the emitter of the transistor Q17 and the collector of the transistor Q18. The resistors R12 and R13 are connected in series between the collector of the transistor Q17 and the ground GND. The resistor R14 is connected between the emitter of the transistor Q18 and a source terminal 42 to which a source potential $V_{EE}$ is applied. The bases of the transistors Q18 to Q21 are connected to a bias terminal 43 to which a bias potential $V_{CS}$ generated within the chip is applied. The registers R15 to R17 are connected between the source terminal 42 and the emitters of the transistors Q19 to Q21, respectively. The collector of the transistor Q19 is connected to a connection between the resistors R12 and R13, the collector of the transistor Q20 is connected to one end of the resistor R19, and the collector of the transistor Q21 is connected to the emitter of the transistor Q22. The resistor R18 is connected between the other end of the resistor R19 and the ground GND. The base of the transistor Q22 is connected to a connection between the resistors R18 and R19, and the collector thereof is connected to the ground GND. The bases of the transistors Q23 and Q24 are respectively connected to the collectors of the transistors Q17 and Q20. The collectors of the transistors Q23 and Q24 are connected to the ground GND. One end of the resistor R20 is connected to the emitter Q23 and the other end thereof is connected to a source terminal 44 to which a source potential $V_{TT}$ is supplied. One end of the resistor R21 is connected to the emitter of the transistor Q24 and the other end thereof is connected to a source terminal 45 to which the source potential $V_{TT}$ is applied. The emitters of the transistors Q23 and Q24 are respectively connected to output terminals 46 and 47, through which ECL level signals are output and supplied to the internal circuit 14. The source terminal 41 is electrically connected to the main source line 15-1 shown in FIGS. 1 and 2, the ground GND is electrically connected to the main source line 15-2, and the source terminal 42 is electrically connected to the main source line 15-3. The source terminals 44 and 45 are electrically connected to the main source line 15-4.

In the above circuit, the TTL level signal input to the input terminal 40 is supplied to the base of the transistor Q13. The emitter potential of the transistor Q13, which is $4V_{BE}$ lower than the source potential $V_{CC}$, is applied to the emitter of the transistor Q17 ($4V_{BE}$ is the sum of the base-emitter voltages $V_{BE}$ of the transistors Q13 to Q16). A bias voltage is applied to the base of the transistor Q17 by a bias circuit constituted by the resistors R16 to R19 and the transistors Q20–Q22. A collector current of the transistor Q17 is supplied to the base of the transistor Q23, and a collector current of the transistor Q20 is supplied to the base of the transistor Q24. Then, an ECL level signal is output through the output terminals 46 and 47 connected to the emitters of the transistors Q23 and Q24. "L" and "H" levels of a TTL level signal is −0.7V and +0.3V, "L" and "H" levels of an ECL level signal is approximately −1.7V and approximately −0.9V respectively.

According to the ECL gate array of the above embodiment, since a desirable one of the peripheral circuit cells 13 can be selected, the degree of freedom of selecting a peripheral circuit cell 13 is increased. Thus, an optimal peripheral circuit cell 13 can be selected in accordance with the design of the internal circuit 14. Since the internal circuit 14 and the peripheral circuit cells 13 can be wired in an optimal manner, thereby increasing the operation speed and reducing skew, the utility and performance of the semicustom integrated circuit can be improved.

The present invention is not limited to the ECL gate array described above as an embodiment but is applicable to a general semicustom integrated circuit such as a MOS gate array and a standard cell type LSI.

What is claimed is:

1. A semicustom integrated circuit comprising:

a plurality of pads arranged on peripheral portions of a chip along four sides of the chip;

a plurality of peripheral circuit cells arranged on a part of the chip to the inside of said pads and selectively connected to said pads, said peripheral circuit cells including an ECL level input circuit, an ECL level output circuit, a TTL level input circuit, and a TTL level output circuit;

an internal circuit arranged on a part of the chip to the inside of said peripheral circuit cells and selectively connected to said peripheral circuit cells;

at least four branch source lines formed on said peripheral circuit cells and connected to at least one of said peripheral circuit cells and said internal circuit;

at least four main source lines surrounding said internal circuit substantially entirely and respectively connected to at least four of said pads to which power for an ECL circuit and power for a TTL circuit are applied; and an interlayer connecting source line for selectively connecting said main source lines with said branch source lines.

2. The semicustom integrated circuit according to claim 1, wherein said branch source lines cross said main source lines.

3. The semicustom integrated circuit according to claim 9, wherein said branch source lines comprise a first-level wiring layer, said interlayer connecting source line comprises a second-level wiring layer, and said main source lines comprise a third-level wiring layer.

4. The semicustom integrated circuit according to claim 3, further comprising:

a first insulating layer formed on said peripheral cells;

a second insulating layer; and a third insulating layer, wherein said first-level wiring layer is formed on said first insulating layer and extends in a first direction which crosses one side of the chip, wherein said second insulating layer is formed on said first-level wiring layer, wherein said second-level wiring layer is formed on said second insulating layer and extends in a second direction perpendicular to the first direction, wherein said third insulating layer is formed on said second-level wiring layer, and wherein said third-level wiring layer is formed on said third insulating layer and extends in the first direction and surrounds said internal circuit, said branch source lines being connected to said peripheral circuit cells through a first through hole formed in said first insulating layer, said interlayer connecting source line being connected to said branch source lines through a second through hole formed in said second insulating layer, and said main source lines being connected to said interlayer connecting source line through a third through hole formed in said third insulating layer, whereby power supplied to said main source lines is supplied to said peripheral circuit cells.

5. The semicustom integrated circuit according to claim 1, wherein said internal circuit is an ECL circuit.

* * * * *